United States Patent [19]

Rolfson et al.

[11] Patent Number: 5,275,237
[45] Date of Patent: Jan. 4, 1994

[54] LIQUID FILLED HOT PLATE FOR PRECISE TEMPERATURE CONTROL

[75] Inventors: J. B. Rolfson; Michael W. Starkweather, both of Boise, Id.

[73] Assignee: Micron Technology, Inc., Boise, Id.

[21] Appl. No.: 965,119

[22] Filed: Oct. 22, 1992

Related U.S. Application Data

[63] Continuation-in-part of Ser. No. 897,722, Jun. 12, 1992, abandoned.

[51] Int. Cl.⁵ .......................... F28F 3/12; F28F 7/00; C23F 1/02
[52] U.S. Cl. .................. 165/80.5; 165/80.1; 165/168; 165/80.4; 156/345
[58] Field of Search ............. 165/80.4, 80.5, 168; 168/170; 156/345

[56] References Cited

U.S. PATENT DOCUMENTS

| | | | |
|---|---|---|---|
| 314,945 | 3/1885 | Korting | 165/168 |
| 2,285,225 | 6/1942 | Norris | 165/170 |
| 2,448,648 | 9/1948 | Zideck | 165/170 |
| 3,524,497 | 8/1970 | Chu et al. | 165/80.4 |
| 3,625,498 | 12/1971 | Adamec et al. | 165/168 |
| 4,092,976 | 6/1978 | Buckner | 165/170 |
| 4,154,222 | 5/1979 | Yu | 165/170 |
| 4,592,415 | 6/1986 | Friedman | 165/80.5 |
| 4,859,304 | 8/1989 | Cathey et al. | 204/298 |
| 5,034,688 | 7/1991 | Moulene et al. | 324/158 |
| 5,070,936 | 12/1991 | Carroll et al. | 165/80.4 |

FOREIGN PATENT DOCUMENTS 1306224  2/1973  United Kingdom ............... 165/80.4

OTHER PUBLICATIONS

Cohen et al., Heat Transfer in a Liquid Cooling System, IBM Technical Disclosure vol. 11, No. 6, Nov. 1968.

*Primary Examiner*—John K. Ford
*Attorney, Agent, or Firm*—Michael W. Starkweather

[57] ABSTRACT

A liquid filled hot plate used in integrated circuit fabrication baking processes. The hot plate uses heated liquid which is pumped throughout a circulatory system, for heating the hot plate. The hot plate has a cavity which has symmetrical parallel partitions dividing the cavity into equal halves, where the inlet fluid line determines the left and right halves. Therefore, temperature control of the hot plate can be achieved to $+/-0.25$ degrees C., and temperature spiking phenomenon can be depreciated.

2 Claims, 5 Drawing Sheets

1

LIQUID FILLED HOT PLATE FOR PRECISE TEMPERATURE CONTROL

This application is a continuation-in-part of application Ser. No. 07/897,722 that was filed on Jun. 6, 1992 now abandoned.

FIELD OF THE INVENTION

The present invention relates to integrated circuit (IC) manufacturing tools; specifically, IC baking tools. Particularly, there is a hot plate which utilizes a cavity which is filled with heated liquid. Uniquely, heating a hot plate with liquid provides for a much greater degree of precise temperature control which is essential for several stages of IC manufacturing.

BACKGROUND OF THE INVENTION

History

Historically, IC wafer manufacturing has implemented heating of IC wafer fabrication through the use of resistive coil heated hot plates. As illustrated in FIG. 1, the typical hot plate 10 includes a resistive coil 12, a main body portion 14, and a heating platform 16 for mounting the wafers upon.

Typically, there are several IC fabrication processes that require precise temperature control across the uniformity of IC wafers. For example, precise temperature control is required for resist thickness control during the soft bake process. Similarly, precision is required during critical dimension and "film speed" control on chemically-amplified resists occurring during post exposure bake processes.

Problems

The prior wafer fabrication hot plate designs do not meet the increasingly precise specifications required for today's IC fabrication baking processes. Specifically, one deficiency entails a known heat spiking effects. This spiking effect occurs by heating a mass which is cooler than the heating elements, which can generate heat much faster than the mass can first absorb or thermally conduct. Thus, when the platform 16 does increase in temperature, it often will increase beyond the specified temperature range. Then the heating elements must be adjusted to a lower setting where the temperature goes too low, and then to a higher setting, etc. Even when one temperature setting is picked, the heating elements turn on and off constantly to maintain the temperature picked; thus creating up and down temperature swings, also called spiking. One can think of this spiking effect to be similar to a loosely damped oscillation of a weight on a spring; first going one way too far then the opposite way too far, and eventually the right equilibrium position (or setting) is attained.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the subject hot plate precise temperature control device. Specifically, there is a hot plate which provides for: 1) a reduced heat spiking phenomenon, 2) provides for precise control of temperature settings, and 3) uses a liquid filled hot plate designed to keep the liquid mixed up and flowing relatively freely therethrough. Furthermore, there is a hot plate which is heated by a liquid which is pumped through a circulatory system. Uniquely, the circulatory system comprises at least one cavity in at least one hot plate, both a supply and drainage system for the cavities, and at least one liquid pumping device.

Features of the present invention will become more clear from the following detailed description of the invention, taken in conjunction with the accompanying drawings.

DETAILED DESCRIPTION OF THE ILLUSTRATED EMBODIMENT

Incorporated Material

The following U.S. patent is herein incorporated by reference:

U.S. Pat. No. 5,034,688, is a temperature conditioning support for small objects such as semiconductor components and thermal regulation process using said support.

U.S. Pat. No. 4,859,304, is a temperature controlled anode for plasma dry etchers for etching semiconductors.

General Embodiment

Figure 1:
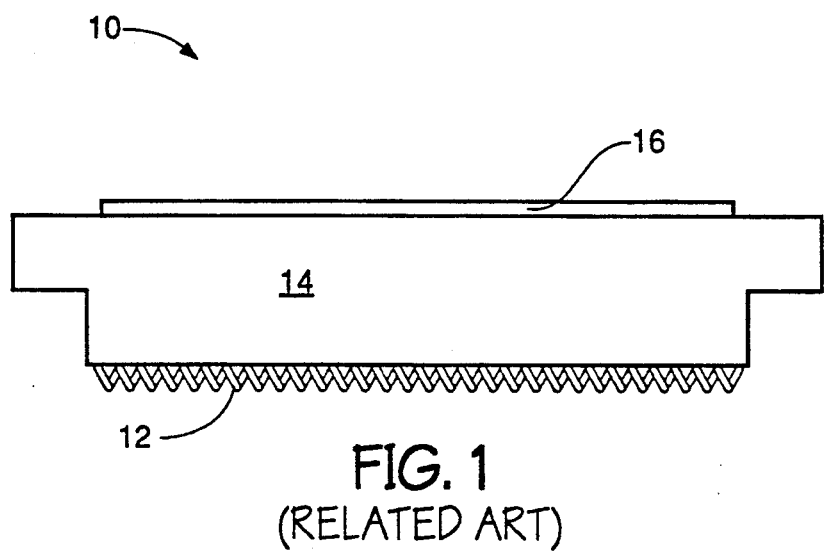
FIG. 1 is a detailed illustration of a related art invention.
Figure 2:
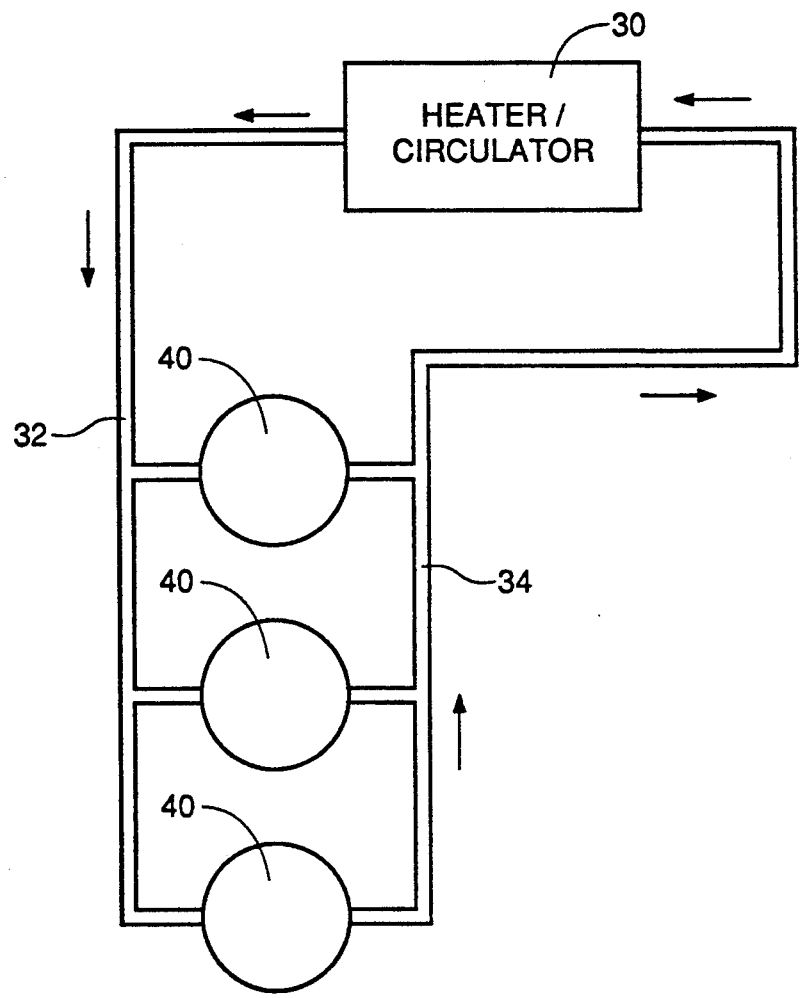
FIG. 2 is a general overall illustration of the invention.

FIG. 2 is a detailed illustration of the invention and includes the following elements: The heart of the circulation system is a heater and circulation pump system 30 (referred to as pump 30). For example, PolyScience Inc., Warrington Pa., model 8000 has a pump heater with liquid temperature stability of +/−0.01 degrees centigrade. At least one supply line 32 leads from pump 30, and at least one drain line 34 leads into pump 30. Connected between supply and drain lines are hot plates 40, which receive and drain fluids via the lines 32 and 34 respectively.

Specific Embodiment

Figure 3:
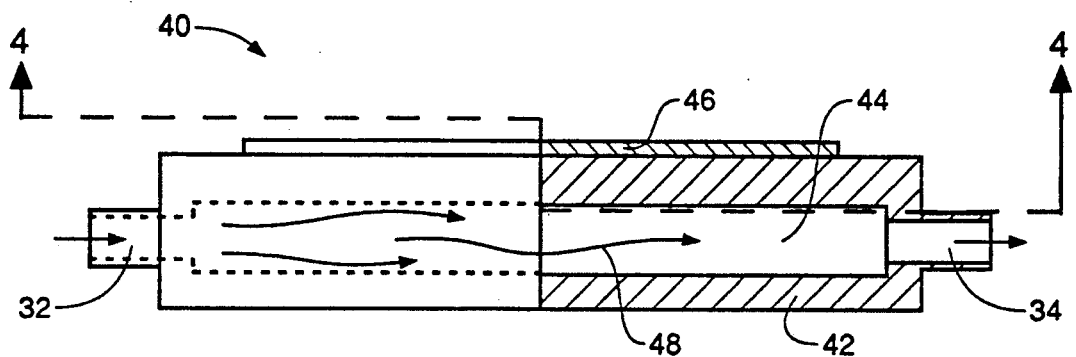
FIG. 3 is a sectional side view of one hot plate.

Referring to FIG. 3, there is illustrated one hot plate 40 showing a side view with a cross-sectional wedge piece removed. Hot plate 40 couples to supply line 32, and drainage line 34. Hot plate body 42 has at least one cavity 44 connected to lines 32 and 34 as illustrated. On top of hot plate 40 is a heating platform 46 for contact with IC wafer devices. Also, illustrated are fluid flow lines 48.

Figure 4:
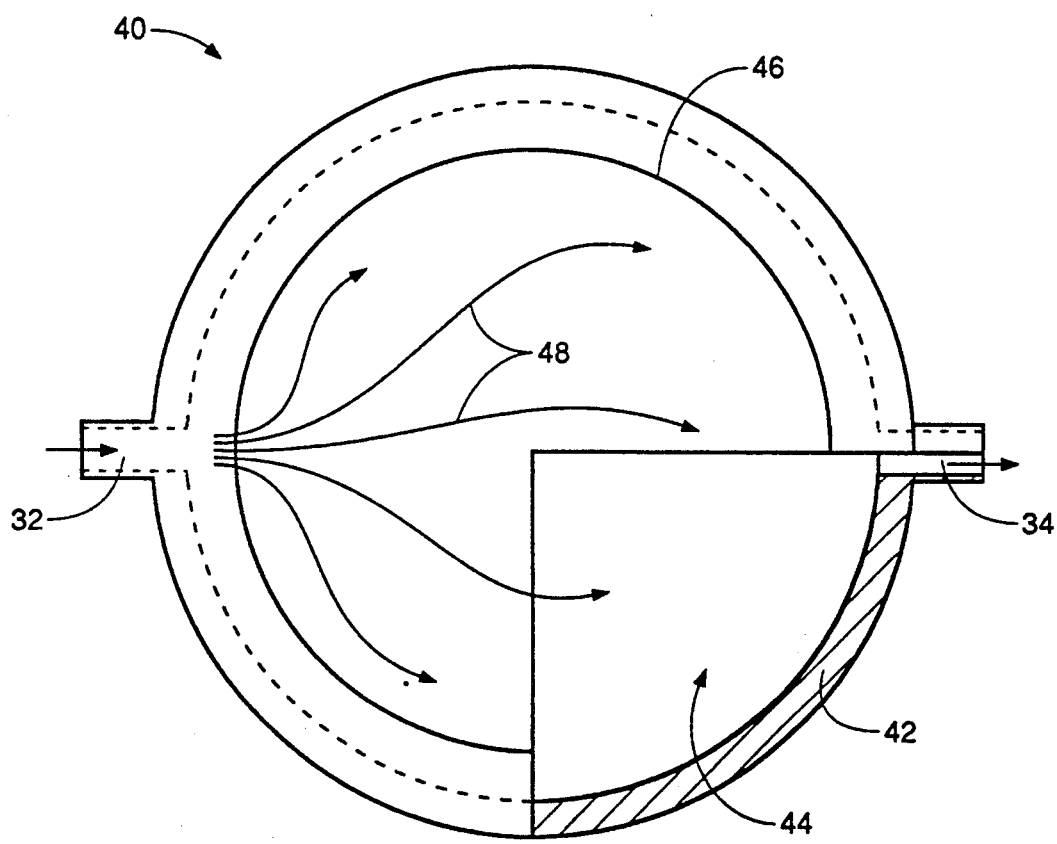
FIG. 4 is a top sectional perspective of the hot plate in FIG. 3.

Referring to FIG. 4, there is a top view of hot plate 40 with a cross-sectional wedge removed. Similarly, like element numbers refer to the same parts identified in previous FIGS. 2 and 3.

In operation, the fluid flow inlets to the hot plates can be monitored down to a temperature precision of +/−0.01 degrees C. Although with differing liquids and monitoring equipment the precision may be somewhat less precise. Thus with this system the heating of the hot plate platform is uniform, and not up and down as much as other heating systems.

Figure 5:
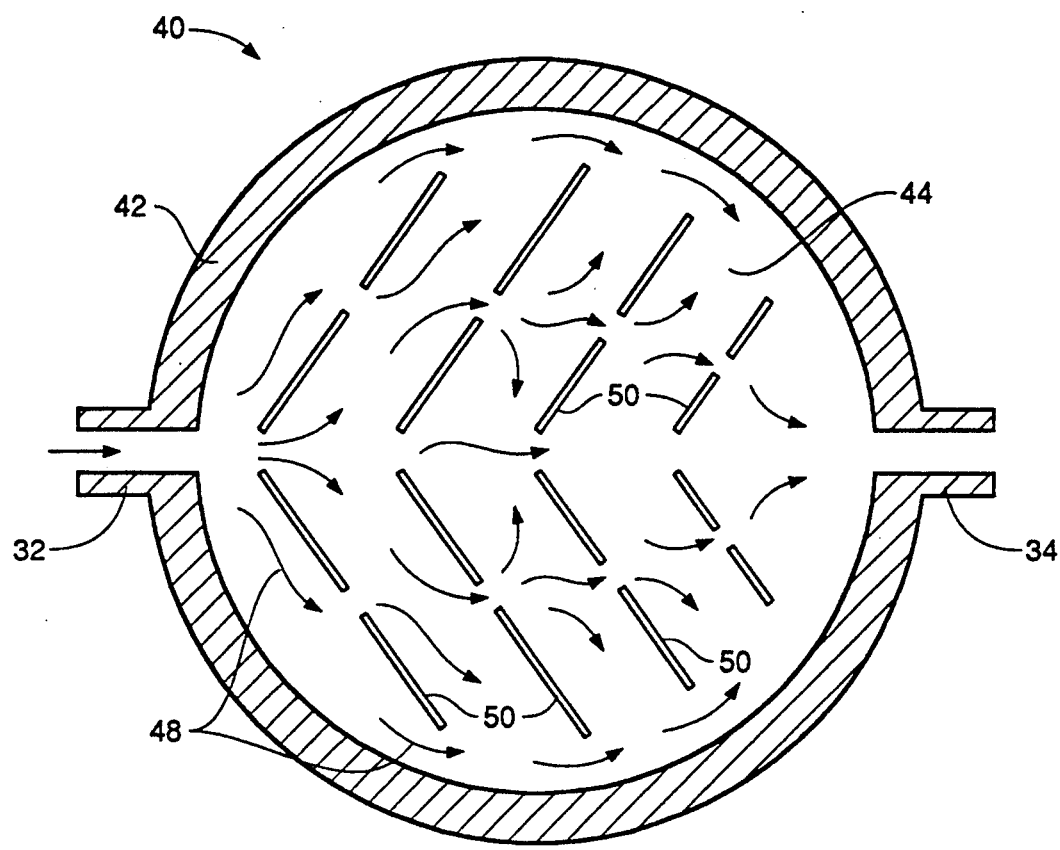
FIG. 5 is a top sectional perspective of an alternative embodiment of the hot plate.

FIG. 5 illustrates a top sectional perspective of an alternative embodiment of the hot plate. Specifically, there is a hot plate 40 that couples to supply line 32, and drainage line 34. Hot plate body 42 has a cavity 44 connected to lines 32 and 34 as illustrated. Arranged in cavity 44, are dividers or partitions 50. The partitions are generally arranged in a "v" shape as shown. This shape provides that the fluid will flow to all portions of the cavity 44 by creating venturies and channels. Also illustrated are fluid flow lines 48.

Figure 6:
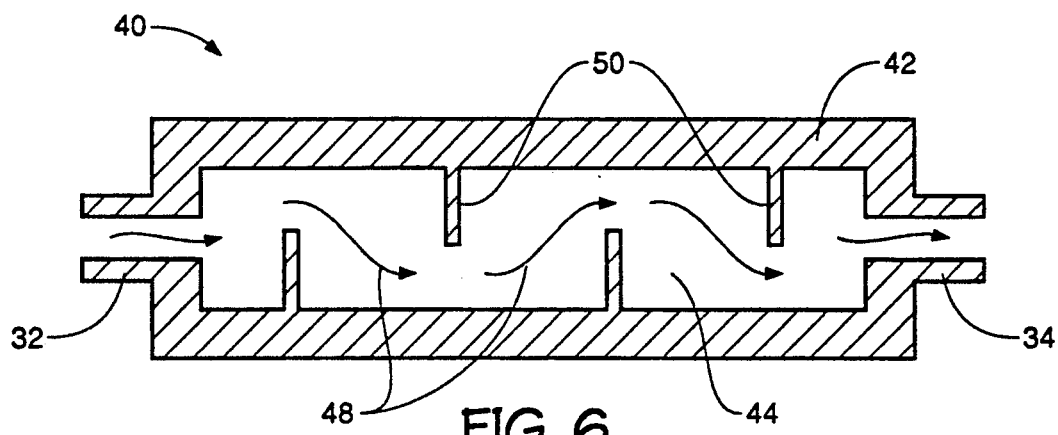
FIG. 6 is a sectional side view of one embodiment of FIG. 5.

FIG. 6 is a sectional side view of one embodiment of FIG. 5, and has the partitions 50 arranged in an alternating top and bottom attachment fashion as shown. This arrangement will provide for vertical mixing of the fluid as it flows through the hot plate assembly.

Figure 7:
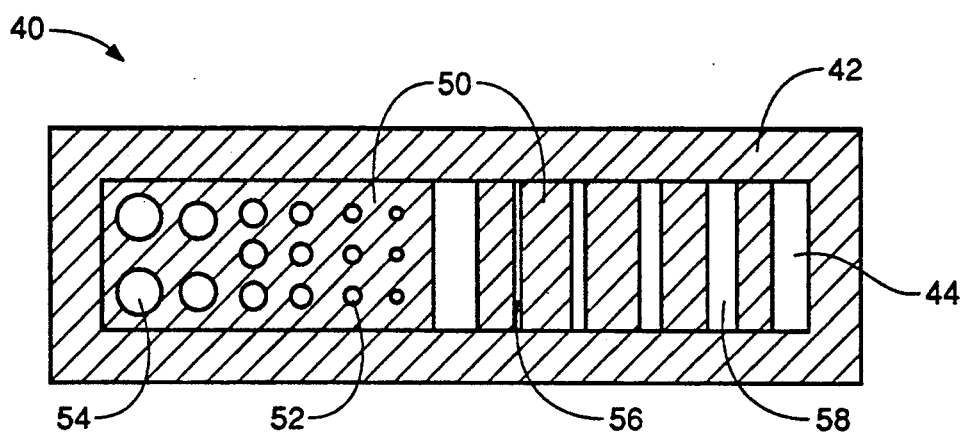
FIG. 7 is a sectional side view of one embodiment for the partitions of FIG. 5.

FIG. 7 is a sectional side view of one embodiment for the partitions of FIG. 5. There are two venting type of arrangements illustrated to demonstrate the general concept. Specifically, the first arrangement for the partitions 50 could have circular-type holes, where the holes in the center portion are smaller holes 52, and gradually increasing in size to larger holes 54 towards the outside of the hot plate. This arrangement takes into account that the liquid pressure is higher in the center, where the liquid is inflowing, and has lower liquid pressure towards the out portions of the cavity 44.

A second arrangement for the partitions 50 is illustrated by slots. Again, the slots are arranged with smaller slots 56 and larger slots 58. Both the slots and holes size progressions work to mix the heated fluid within the cavity of the hot plate to create even distribution of the heated liquid. This will serve to prevent temperature variations on the top surface of the hot plate.

Figure 8:
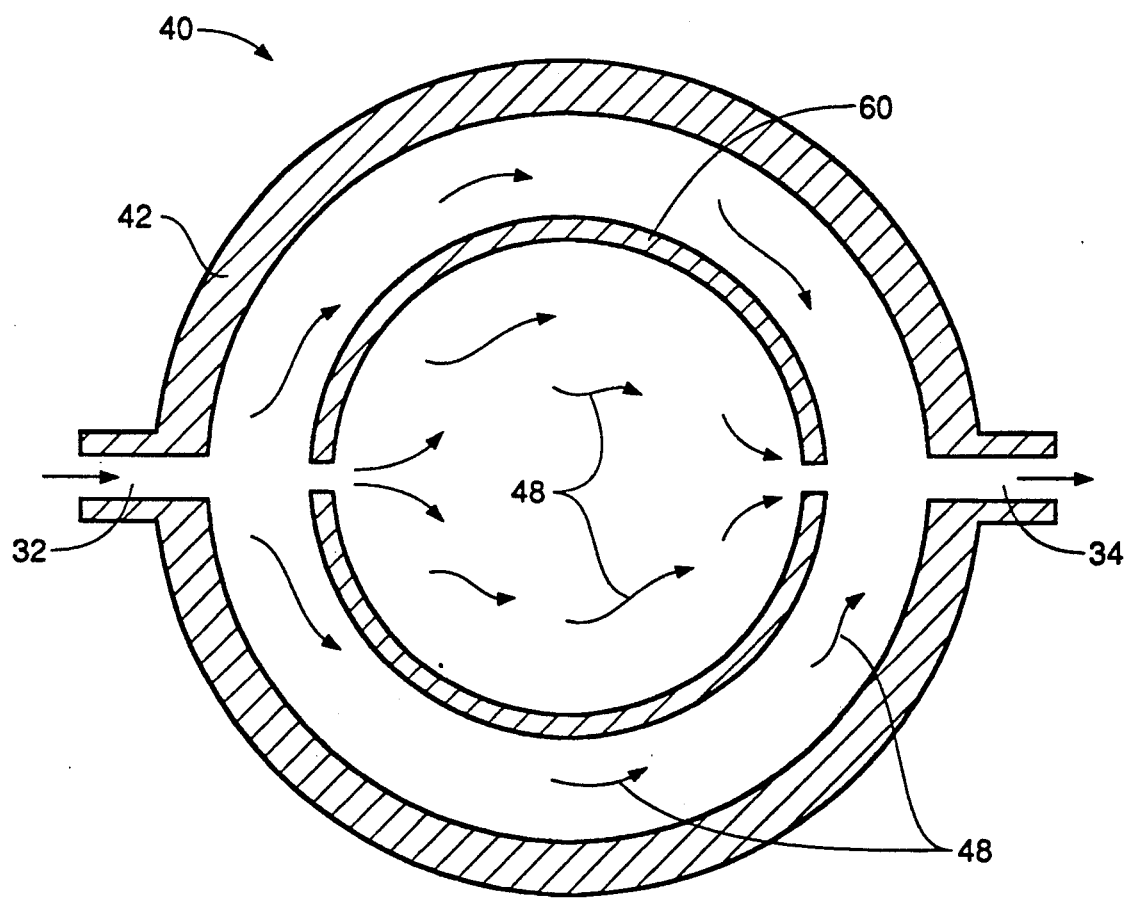
FIG. 8 is a top sectional perspective of an alternative embodiment of the hot plate.

FIG. 8 is a top sectional perspective of an alternative embodiment of the hot plate. Generally, this embodiment illustrates the concept of having at least one fluid channel that is parallel to the outer wall. This is accomplished by providing inner walls 60.

Variations in the Invention

There are several obvious variations to the broad invention and thus come within the scope of the present invention. Uniquely, this invention may work with any form of heating elements illustrated as heater/circulator 30. Specifically, electrical, gas, chemical etc. will all work sufficiently to heat the liquid. Additionally, any form of pumping the circulator 30 is envisioned as working. Specifically, electric, hydraulic, etc. is adequate. Moreover, the heater and circulator 30 does not have to be one unit, but can be separate units or a chain of units dispersed along the entire circulatory system when liquid is supplied to many hot plates. Although, cavity 44 is shown as a single smooth walled cavity, this is not required. In fact, a plurality of cavities and an irregular surface may be useful for heat conduction to the heated platform 46. Similarly, the entry and exit of the lines 32 and 34 may be arranged in a variety of locations to effect proper fluid circulation. Notably, the fluid, roughly illustrated by flow lines 48, may be any heat conducting fluid; like, water or oil. Moreover, hot plates 40 may be connected in any variety of patterns, unlike the one pattern illustrated in FIG. 2. Again, the illustrated circular shape of the hot plate 40 may be designed with any variety of shapes suitable for its intended purposes.

It is also noted, the idea of having holes or slots in the partitions may also be varied by having a progression of size increase going from the inlet portion 32 to the outlet portion 34 of the hot plate; this accommodates for a pressure gradient from the inlet to the outlet.

It is noted that FIG. 8 may be modified by providing several inner walls like wall 60. Additionally, this idea may be varied by combining the embodiment with the embodiment illustrate in FIG. 6 and 7.

While the invention has been taught with specific reference to one embodiment, someone skilled in the art will recognize that changes can be made in form and detail without departing from the spirit and the scope of the invention.

Although subheadings in the Detailed Description of the Illustrated Embodiment are used, these are merely provided for assisting the reader; wherein, the writer is free to enter any information under any heading/s.

I claim:

1. A heating plate device, comprising:
a) a body for supporting integrated circuit wafers during fabrication, where said body contains a cavity, the cavity is divided into equal left and right areas;
b) a supply inlet means for supplying heated liquid to the cavity, the supply inlet means is the dividing point of the cavity which determines the equal left and right area;
   a drain outlet means for draining the heated liquid from the cavity; and
   the cavity is arranged with a plurality of parallel spaced partitions wherein each partition has a general overall "V"configuration, where each apex of each partition's "V" is pointed towards the supply means so that one half of the "V" is in the right area of the cavity and the other half is in the right area to form two symmetrical halves and the apex of each partition is removed;
c) a first set of partitions, located closest to the supply means, that are only attached to the bottom of the cavity an have a gap along the top of the cavity;
d) a second set of partitions, located second closest to the supply means, that are only attached to the top of the cavity and have a gap along the bottom of the cavity;
e) a third set of partitions, located third closest to the supply means, that are attached and arranged as the first set of partitions;
f) a fourth set of partitions, located fourth closest to the supply means, that are attached and arranged as the second set of partition;
g) the first set of partitions having a first, second, third, and fourth set of holes, comprising:
   the first set of holes with a first size, located first closest to the center line, running from the inlet to the outlet means of the hot plate;
   the second set of holes with a second size being larger than the first size, located second closest to the center line;
   the third set of holes with a third size being larger than the second size, located third closest to the center line; and the fourth set of holes with a fourth size being larger than the third size, located fourth closest to the center line;

h) the second set of partitions having a first, second, third, and fourth set of holes, comprising;

the first set of holes with a first size, located first closest to the center line, running from the inlet to the outlet means of the hot plate;

the second set of holes with a second size being larger than the first size, located second closest to the center line;

the third set of holes with a third size being larger than the second size, located third closest to the center line; and the fourth set of holes with a fourth size being larger than the third size, located fourth closest to the center line;

i) the third set of partitions having a first, second, third, and fourth set of holes, comprising:

the first set of holes with a first size, located first closest to the center line, running from the inlet to the outlet means of the hot plate;

the second set of holes with a second size being larger than the first size, located second closest to the center line;

the third set of holes with a third size being larger than the second size, located third closest to the center line; and the fourth set of holes with a fourth size being larger than the third size, located fourth closest to the center line; and j) the fourth set of partitions, having a first, second, third, and fourth set of holes, comprising:

the first set of holes with a first size, located first closest to the center line, running from the inlet to the outlet means of the hot plate;

the second set of holes with a second size being larger than the first size, located second closest to the center line;

the third set of holes with a third size being larger than the second size, located third closest to the center line; and the fourth set of holes with a fourth size being larger than the third size, located fourth closest to the center line.

2. An integrated circuit fabrication bake process heating system, comprising:

a) a liquid pump for pumping liquid;
b) a liquid heater for heating the liquid;
c) a supply inlet line, connected to a drainage end of the liquid pump and heater;
d) a drainage outlet line, connected to a supply side of the liquid pump and heater; and
e) at least one hot plate having a cavity, wherein the hot plate includes:
   i) a body for supporting the integrated circuit during a fabrication bake process;
   ii) the cavity being connected to the liquid supply and drainage lines so as to receive heated liquid from the supply line in the hot plate cavity and to drain the heated liquid from the cavity to the drainage line the cavity having a center dividing line determining equal left and right areas, the center line originates from the liquid supply line;
   iii) the cavity having a plurality of parallel partitions, each partition is arranged in two portions that are symmetrical to each other, where the first and second portions form oblique angles to the center line resembling a "V" shape where the apex of the "V" is removed to allow liquid to flow therethrough to the supply output line;

f) a first set of partitions, located closest to the supply line, that are only attached to the bottom of the cavity and have a gap along the top of the cavity;

g) a second set of partitions, located second closest to the supply line, that are only attached to the top of the cavity and have a gap along the bottom of the cavity;

h) a third set of partitions, located third closest to the supply line, that are attached and arranged as the first set of partitions;

i) a fourth set of partitions, located fourth closest to the supply line, that are attached and arranged as the second set of partitions;

j) the first set of partitions having a first, second, third, and fourth set of holes, comprising:

the first set of hoes with a first size, located first closest to the center line, running from the inlet to the outlet line of the hot plate;

the second set of holes with a second size being larger than the first size, located second closest to the center line;

the third set of holes with a third size being larger than the second size, located third closest to the center line; and the fourth set of hoes with a fourth size being larger than the third size, located fourth closest to the center line;

k) the second set of partitions having a first, second, third, and fourth set of holes, comprising:

the first set of holes with a first size, located first closest to the center line, running from the inlet to the outlet line of the hot plate;

the second set of hoes with a second size being larger than the first size, located second closest to the center line;

the third set of holes with a third size being larger than the second size, located third closest to the center line; and the fourth set of holes with a fourth size being larger than the third size, located fourth closest to the center line;

l) the third set of partitions having a first, second, third, and fourth set of holes, comprising:

the first set of holes with a first size, located first closest to the center line, running from the inlet to the outlet line of the hot plate;

the second set of holes with a second size being larger than the first size, located second closest to the center line;

the third set of holes with a third size being larger than the second size, located third closest to the center line; and the fourth set of holes with a fourth size being larger than the third size, located fourth closest to the center line; and m) the fourth set of partitions, having a first, second, third, and fourth set of holes, comprising:

the first set of holes with a first size, located first closest to the center line, running from the inlet to the outlet line of the hot plate;

the second set of holes with a second size being larger than the first size, located second closest to the center line;

the third set of holes with a third size being larger than the second size, located third closest to the center line; and the fourth set of holes with a fourth size being larger than the third size, located fourth closest to the center line.

* * * * *